United States Patent
Zhao et al.

(10) Patent No.: US 12,336,284 B2
(45) Date of Patent: Jun. 17, 2025

(54) METHOD FOR MANUFACTURING THIN FILM TRANSISTOR ARRAY SUBSTRATE AND DISPLAY PANEL

(71) Applicant: GUANGZHOU CHINA STAR OPTOELECTRONICS SEMICONDUCTOR DISPLAY TECHNOLOGY CO., LTD., Guangdong (CN)

(72) Inventors: Jun Zhao, Guangdong (CN); Bin Zhao, Guangdong (CN); Juncheng Xiao, Guangdong (CN); Shan Li, Guangdong (CN); Wei Wu, Guangdong (CN)

(73) Assignee: GUANGZHOU CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/756,639

(22) PCT Filed: Apr. 15, 2022

(86) PCT No.: PCT/CN2022/087106
§ 371 (c)(1),
(2) Date: May 28, 2022

(87) PCT Pub. No.: WO2023/178763
PCT Pub. Date: Sep. 28, 2023

(65) Prior Publication Data
US 2024/0162253 A1    May 16, 2024

(30) Foreign Application Priority Data
Mar. 24, 2022 (CN) .......................... 202210297429.6

(51) Int. Cl.
*H10D 86/01* (2025.01)
*H10D 30/67* (2025.01)
(Continued)

(52) U.S. Cl.
CPC ..... *H10D 86/0227* (2025.01); *H10D 30/6755* (2025.01); *H10D 86/423* (2025.01); *H10D 86/60* (2025.01)

(58) Field of Classification Search
CPC ............ H01L 27/1225; H01L 29/7869; H01L 27/1274; H01L 27/1277; H01L 27/1281;
(Continued)

(56) References Cited

U.S. PATENT DOCUMENTS

2011/0133197 A1    6/2011  Suzumura et al.
2013/0015438 A1*   1/2013  Yamazaki ........... H01L 27/1225
                                                257/E29.296
2021/0217872 A1    7/2021  Qu et al.

FOREIGN PATENT DOCUMENTS

CN    107507866 A    12/2017
CN    109742028 A    5/2019
(Continued)

OTHER PUBLICATIONS

Translation kr20150079215 (Year: 2015).*
(Continued)

*Primary Examiner* — Latanya N Crawford Eason
(74) *Attorney, Agent, or Firm* — PV IP PC; Wei Te Chung (57) ABSTRACT

The present disclosure provides a method for manufacturing a thin film transistor array substrate and a display panel. The method includes: forming a plurality of dispersed metal oxide grains on a substrate; forming an amorphous metal oxide semiconductor layer in contact with the plurality of metal oxide grains, and at least one metal element in the (Continued)

metal oxide grain is same as metal elements in the metal oxide semiconductor layer; performing an annealing process on the amorphous metal oxide semiconductor layer, to obtain a crystallized metal oxide semiconductor layer.

16 Claims, 7 Drawing Sheets

(51) Int. Cl.
*H10D 86/40* (2025.01)
*H10D 86/60* (2025.01)

(58) Field of Classification Search
CPC .......... H10D 86/0227; H10D 30/6755; H10D 86/423; H10D 86/60; H10D 86/0229; H10D 86/0223
See application file for complete search history.

(56) References Cited

FOREIGN PATENT DOCUMENTS

| | | | | |
|---|---|---|---|---|
| CN | 112599703 A | | 4/2021 | |
| KR | 20150079215 A | * | 7/2015 | ......... H01L 27/1274 |

OTHER PUBLICATIONS

International Search Report in International application No. PCT/CN2022/087106, mailed on Aug. 25, 2022.
Written Opinion of the International Search Authority in International application No. PCT/CN2022/087106, mailed on Aug. 25, 2022.

* cited by examiner

METHOD FOR MANUFACTURING THIN FILM TRANSISTOR ARRAY SUBSTRATE AND DISPLAY PANEL

TECHNICAL FIELD

The present disclosure relates to a display technology field, and in particular, to a method for manufacturing a thin film transistor array substrate and a display panel.

BACKGROUND

With the development of display panels in directions of a large size, a high resolution, a high frequency, a self-emitting display mode, and the like, there are higher and higher requirements for the mobility and stability of a thin film transistor which controls the switch and drives the display. At present, amorphous silicon thin film transistor devices commonly used in the display industry have low mobility, the on-state current is low, and the requirements for high-end display products cannot be met. The mobility of metal oxide transistors is 10 to 100 times than that of amorphous silicon transistors, and thus the requirements for the high-end display products can be met. Therefore, the metal oxide transistors are receiving increasing attention in the industry.

However, the commonly used metal oxide semiconductor layers usually can be crystallized at a high temperature of 600° C. or more, and thus there is a problem that the crystallization temperature is too high.

Technical Problems

The present disclosure is intended to provide a method for manufacturing a thin film transistor array substrate and a display panel to reduce a temperature required for crystallization of a crystallized metal oxide semiconductor layer of a thin film transistor.

Technical Solutions

A method for manufacturing a thin film transistor array substrate, wherein the method includes:
Forming a plurality of dispersed metal oxide grains on a substrate;
Forming an amorphous metal oxide semiconductor layer in contact with the plurality of the metal oxide grains, wherein at least one metal element in the metal oxide grain is same as metal elements in the metal oxide semiconductor layer;
performing an annealing process on the amorphous metal oxide semiconductor layer, to obtain a crystallized metal oxide semiconductor layer.

A display panel including a thin film transistor array substrate, wherein the thin film transistor array substrate is manufactured by the above method for manufacturing the thin film transistor array substrate.

Beneficial Effects

The present disclosure provides a method for manufacturing a thin film transistor array substrate and a display panel. Form a plurality of dispersed metal oxide grains on a substrate. Form an amorphous metal oxide semiconductor layer in contact with the plurality of metal oxide grains, and at least one metal element in the metal oxide grain is same as metal elements in the metal oxide semiconductor layer. Perform an annealing process on the amorphous metal oxide semiconductor layer. The metal oxide grains are used to induce crystallization during the annealing process of the metal oxide semiconductor layer, which reduces the crystallization temperature required for annealing the amorphous metal oxide semiconductor layer, improves the stability of the metal oxide film transistor, and facilitates the mass production of the metal oxide thin film transistor display plane.

EMBODIMENT OF THE PRESENT DISCLOSURE

The technical solutions in the embodiments of the present disclosure are described clearly and completely with reference to the accompanying drawings in the embodiments of the present disclosure. It will be apparent that the described embodiments are only some but not all of embodiments of the present disclosure. Based on the embodiments of the present disclosure, other embodiments obtained by a person skilled in the art without creative efforts are all within the scope of the present disclosure.

Figure 1:
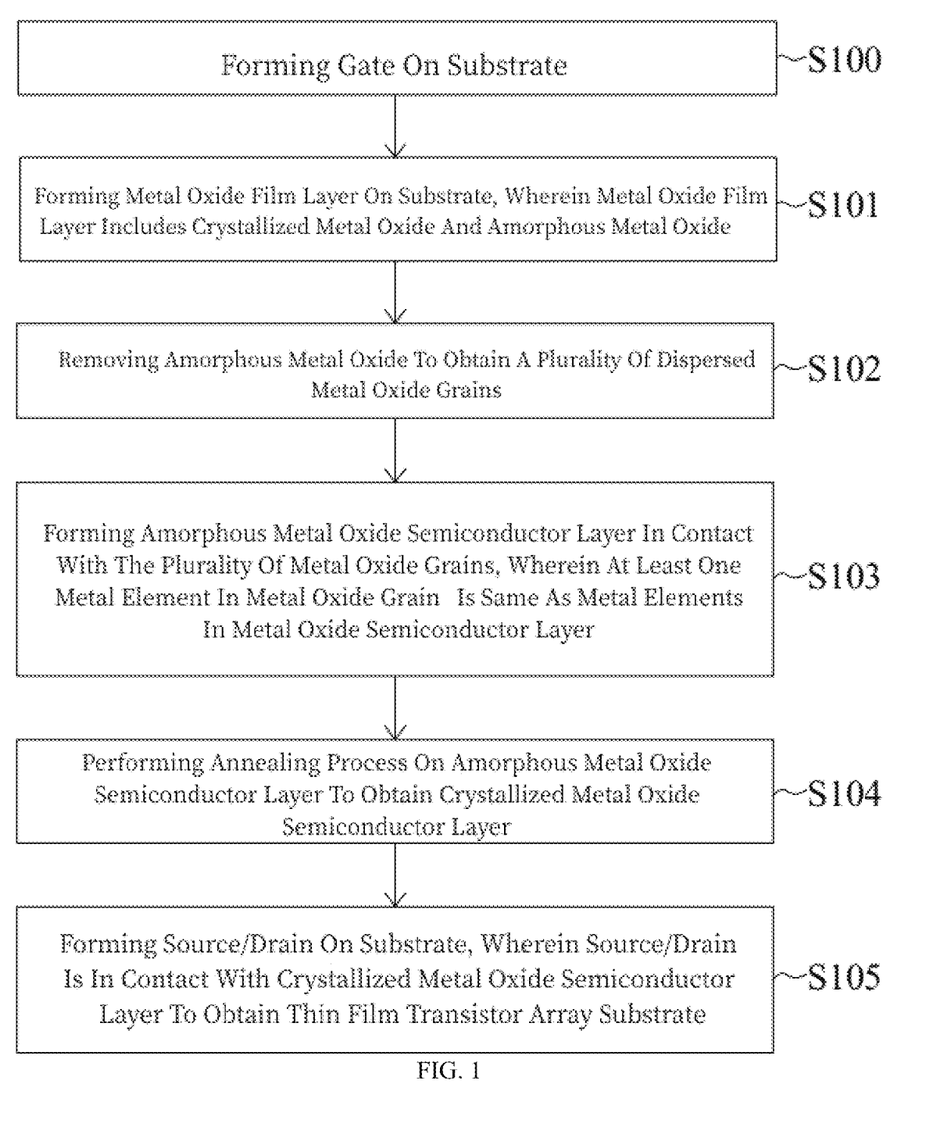
FIG. 1 is a flowchart of manufacturing a thin film transistor array substrate according to a first embodiment of the present disclosure.

Referring to FIG. 1, FIG. 1 is a flowchart of manufacturing a thin film transistor array substrate according to a first embodiment of the present disclosure. A method of manufacturing the thin film transistor array substrate includes the steps of:

S100: Form a gate on a substrate.

Figure 2A:
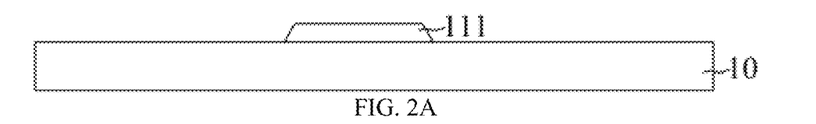
FIG. 2A-2G are schematic views of a manufacturing process of a thin film transistor array substrate according to the first embodiment of the present disclosure.

A substrate 10 is provided, a first conductive layer is formed on the substrate 10 by physical sputtering deposition, and the first conductive layer is patterned by a first patterning process, to obtain a gate electrode 111, as shown in FIG. 2A. The thickness of the first conductive layer is 800 angstroms –10000 angstroms, for example, 1,000 angstroms, 1,500 angstroms, 1,600 angstroms, 2,000 angstroms, 2,500 angstroms, 3,000 angstroms, 4,000 angstroms, and 5,000 angstroms. A material for preparing the first conductive layer is selected from at least one of molybdenum, aluminum, titanium, copper, and silver.

S101: Form a metal oxide film layer on the substrate, wherein the metal oxide film layer includes a crystallized metal oxide and an amorphous metal oxide.

Figure 2B:
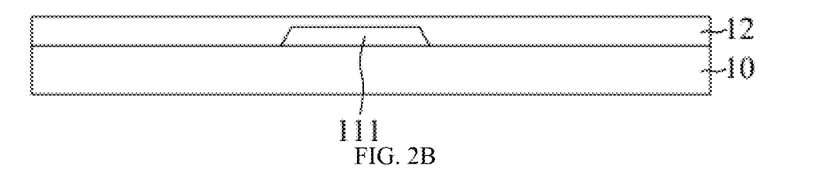

First, a gate insulating layer 12 covering the gate 111 and the substrate 10 is formed by the chemical vapor deposition, as shown in FIG. 2B. The thickness of the gate insulating layer 12 is 800 angstroms –3,000 angstroms, for example, 1,000 angstroms, 1,500 angstroms, 1,600 angstroms, 2,000 angstroms, 2,500 angstroms, and 3,000 angstroms A material for preparing the gate insulating layer 12 is selected from at least one of silicon nitride or silicon oxide.

Figure 2C:
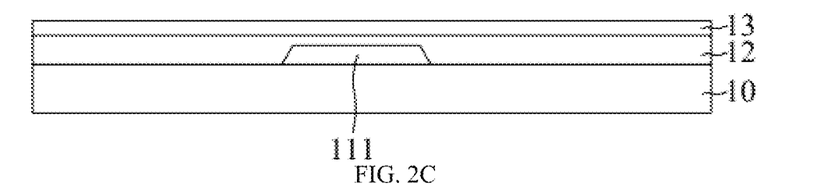

Next, a metal oxide film layer 13 is formed on the gate insulating layer 12 by a magnetron sputtering physical vapor deposition in an inert gas atmosphere by using a first metal oxide target as a raw material, as shown in FIG. 2C. The metal oxide film layer 13 includes a crystallized metal oxide and an amorphous metal oxide. The thickness of the metal oxide film layer 13 is greater than or equal to 200 nm and less than or equal to 1,500 nm, for example, 300 nm, 400 nm, 500 nm, 600 nm, 700 nm, 800 nm, 1,000 nm, 1,200 nm, 1,300 nm, and 1,500 nm. The metal included in the metal oxide film layer 13 includes one or two of In, Ga, Zn, and Sn. The inert gas includes argon.

Specifically, the first metal oxide target is an ITO (Indium Tin Oxide) target, and the thickness of the metal oxide film layer 13 is 1,500 angstroms.

Figure 3:
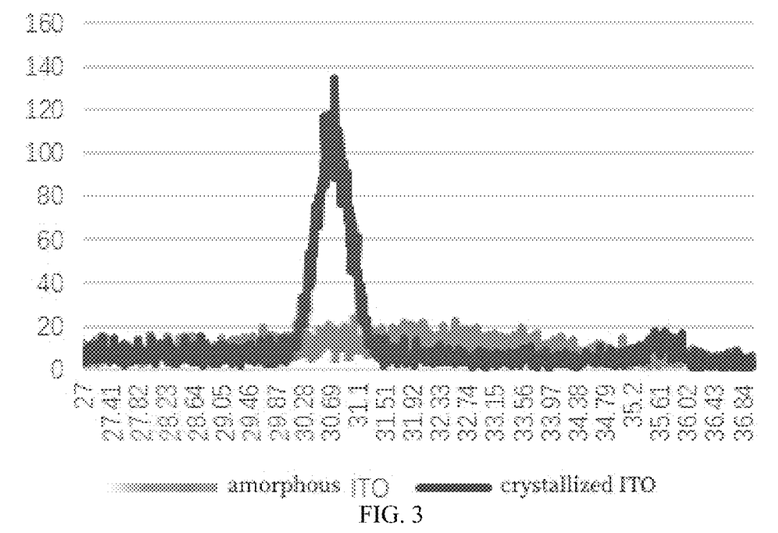
FIG. 3 shows X-ray diffraction diagrams of a crystallized indium tin oxide and amorphous indium tin oxide in the metal oxide film layer when the metal oxide film layer in FIG. 2C is an indium tin oxide layer.

As shown in FIG. 3, when the metal oxide film layer 13 is an indium tin oxide layer, the indium tin oxide layer includes crystallized indium tin oxide and amorphous indium tin oxide, the crystalline peak of the crystallized indium tin oxide is at 30.69°, and the amorphous indium tin oxide has no obvious crystalline peak.

The Indium tin oxide is a mixture of indium oxide ($In_2O_3$) and tin oxide ($SnO_2$), in which the proportion of the indium oxide ($In_2O_3$) is about 90% in weight. The crystallized indium tin oxide includes mainly indium oxide, and some of the tin oxide is solid-soluted in the indium oxide crystal lattice. In the crystallized indium tin oxide, induces indium oxide included in the amorphous semiconductor layer grows along the crystal nucleus, so that the amorphous semiconductor layer is converted into a crystallized semiconductor layer.

It may be understood that the material for preparing the metal oxide film layer 13 may also be indium oxide, zinc oxide, or indium zinc oxide. The material for preparing the metal oxide film layer 13 is also indium oxide, zinc oxide, or indium zinc oxide, and indium tin oxide is a commonly used material in the display panel manufacturing process, and the process is very mature.

S102 Remove the amorphous metal oxide to obtain a plurality of dispersed metal oxide grains.

Figure 2D:
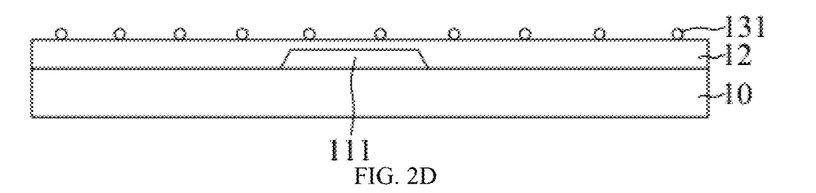

A plurality of amorphous metal oxides are removed by wet etching to obtain a plurality of dispersed metal oxide grains 131 on a surface of the gate insulating layer 12 away from the gate 111, as shown in FIG. 2D. A size of the metal oxide grain 131 is greater than or equal to 5 nm and less than or equal to 100 nm. For example, A size of the metal oxide grain is 10 nm, 20 nm, 30 nm, 40 nm, 50 nm, 60 nm, 70 nm, or 80 nm, so as to avoid aggregation of the metal oxide grains 131 into a sheet shape while the crystallization-induced performance of the metal oxide grains 131 is guaranteed. The solvent for wet etching is oxalic acid or nitric acid.

Figure 4:
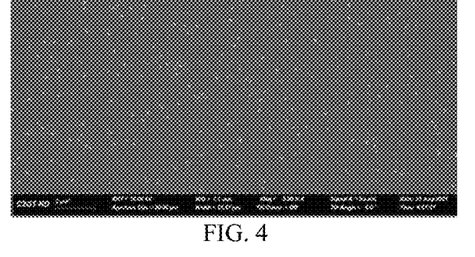
FIG. 4 is a scanning electron micrograph of a plurality of dispersed metal oxide grains.

As shown in FIG. 4, when the metal oxide film layer 13 includes indium tin oxide, (white portions of) a plurality of crystallized indium tin oxide grains are dispersed irregularly.

It should be noted that since an etching rate of the crystallized metal oxide is much lower than an etching rate of the amorphous metal oxide in the wet etching, a plurality of dispersed metal oxide grains composed of the crystallized metal oxide may remain after the amorphous metal oxide is etched. For example, since an etching rate of the crystallized indium tin oxide is only about 1/100 of an etching rate of the amorphous indium tin oxide, the crystallized indium tin oxide remains after the amorphous indium tin oxide is etched.

In addition, there is a problem that, comparing to crystallization of a subsequent amorphous metal oxide semiconductor layer induced by the crystallized oxide in the metal oxide film layer, it is more difficult for the crystallized oxide in the metal oxide film layer to contact with the amorphous metal oxide semiconductor layer and thus it is difficult for the crystallized oxide in the metal oxide film layer to induce crystallization of the amorphous metal oxide semiconductor layer. In the present disclosure, the amorphous metal oxide in the metal oxide film layer is removed and the metal oxide grains composed of the crystallized oxide remains. The metal oxide grains are used to induce crystallization of the amorphous metal oxide semiconductor layer formed subsequently. The metal oxide grains can more fully contact with the amorphous metal oxide semiconductor layer, and it is easier to induce the crystallization of the amorphous metal oxide semiconductor layer at a lower temperature.

Further, when the material for preparing the metal oxide film layer 13 is indium tin oxide, the indium tin oxide layer has conductivity. The crystallization of the subsequent amorphous metal oxide semiconductor layer is directly induced by the conductive metal oxide film layer 13, which can cause a problem that a channel of the metal oxide semiconductor layer is turned on by the conductive metal oxide film layer 13. In turn, the channel function of the metal oxide semiconductor layer 13 is disabled. In addition, when the material for preparing the metal oxide film layer 13 is indium oxide, zinc oxide, or indium zinc oxide, crystallization of the amorphous metal oxide semiconductor layer is induced by the crystallized oxide in the metal oxide film layer 13, which can cause the metal oxide film layer 13 to have a semiconductor front channel. Therefore, it is inconsistent with the design of the subsequently formed metal oxide semiconductor film layer having a semiconductor front channel.

S103: Form an amorphous metal oxide semiconductor layer in contact with the plurality of metal oxide grains, wherein at least one metal element in the metal oxide grain is same as metal elements in the metal oxide semiconductor layer.

Figure 2E:
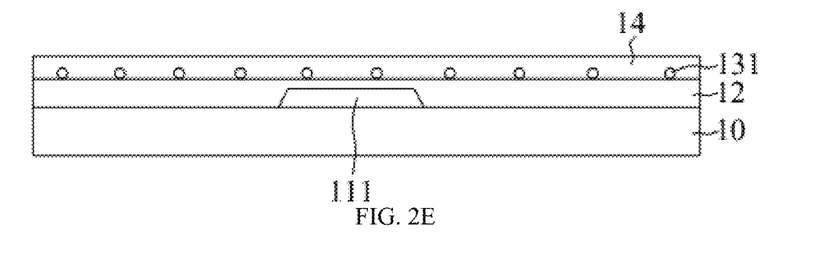

An amorphous metal oxide semiconductor layer 14 is formed on the gate insulating layer 12 in a mixed atmosphere of an inert gas and oxygen gas by magnetron sputtering physical vapor deposition with a second metal oxide target as a raw material, as shown in FIG. 2E. A thickness of the metal oxide semiconductor layer 14 is greater than or equal to 10 nm and less than or equal to 2,000 nm, for example, 50 nm, 100 nm, 150 nm, 200 nm, 300 nm, 500 nm, 800 nm, 1,000 nm, 1,200 nm, 1,500 nm, 1,600 nm, 1,800 nm. Metal elements in the metal oxide semiconductor layer 14 include at least three of In, Ga, Zn, and Sn. The inert gas includes argon.

At least one metal element in the metal oxide grain is same as the metal elements in the metal oxide semiconductor layer, so that the metal oxide grains can induce crystallization of the amorphous metal oxide semiconductor layer during annealing of the amorphous metal oxide semiconductor layer. For example, the metal elements in the metal oxide semiconductor layer include In, Ga, and Zn, and the metal elements in the metal oxide grains 131 include at least one of In, Ga, and Zn. Alternatively, the metal elements in the metal oxide semiconductor layer include In, Ga, and Sn, and the metal elements in the metal oxide grains include at least one of In, Ga, and Sn.

Specifically, when the metal oxide film layer 13 is an indium tin oxide layer, the second metal oxide target is indium gallium zinc oxide, and the metal oxide semiconductor layer 14 is an indium gallium zinc oxide layer.

Figure 5:
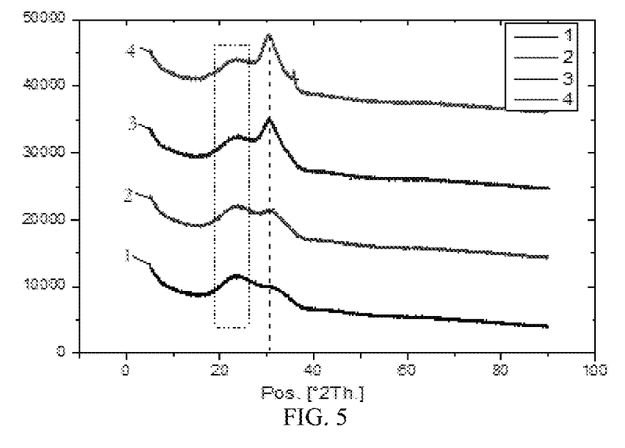
FIG. 5 is an X-ray diffraction diagrams of amorphous indium gallium zinc oxide of the non-crystallized metal oxide semiconductor layer of FIG. 2E and crystalline indium gallium zinc oxide of the crystallized metal oxide semiconductor layer of FIG. 2F.

As shown in FIG. 5, lines 1 and line 2 in FIG. 5 are X-ray diffraction patterns of amorphous indium gallium zinc oxide obtained at different deposition powers. In a broken line frame, a crystallization characteristic peak of the glass substrate is shown, and no other relevant crystallization characteristic peak appears. Therefore, the amorphous indium gallium zinc oxide has no crystallization characteristic peak.

S104: Perform an annealing process on the amorphous metal oxide semiconductor layer to obtain a crystallized metal oxide semiconductor layer.

Figure 2F:
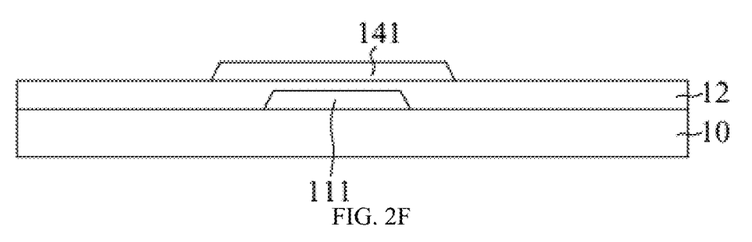

Specifically, the amorphous metal oxide semiconductor layer 14 is heated for 0.5 h to 1.5 h at an annealing temperature greater than or equal to 300° C. and less than or equal to 450° C. The annealed metal oxide semiconductor layer 14 is patterned by using a second patterning process to obtain a crystallized metal oxide semiconductor layer 141, as shown in FIG. 2F. The annealing temperature may be 320° C., 350° C., 380° C., 400° C., 420° C., or 450° C., and the annealing time may be 30 min, 40 min, 50 min, 60 min, or 80 min.

As shown in FIG. 5, lines 3 and line 4 are X-ray diffraction patterns of crystallized indium gallium zinc oxide obtained by an annealing process from an amorphous indium gallium zinc oxide layer obtained at different deposition powers, and the crystallization characteristic peak of the crystallized indium gallium zinc oxide is about 30°. With reference to lines 3 and line 4 in FIG. 5, it can be seen that the deposition of the amorphous indium gallium zinc oxide layer under different deposition conditions does not affect the crystallization of the crystallized indium gallium zinc oxide.

It should be noted that since at least one metal element in the metal oxide grain is same as the metal elements in the metal oxide semiconductor layer. Crystal lattice parameters of the crystals in the metal oxide grains are similar with crystal lattice parameters of crystals in the crystallized metal oxide semiconductor layer. The metal oxide grains serve as the crystal nuclei for inducing crystallization of the amorphous metal oxide semiconductor layer under the condition of less than 450° C. The crystallization temperature of the amorphous metal oxide semiconductor layer is significantly lower than the crystallization temperature of 600° C. or more of the current metal oxide semiconductor layer, which facilitates the mass production of the crystallized metal oxide thin film transistor and improves the device stability of the metal oxide transistor.

S105: Form a source/drain on the substrate, wherein the source/drain is in contact with the crystallized metal oxide semiconductor layer to obtain a thin film transistor array substrate.

Figure 2G:
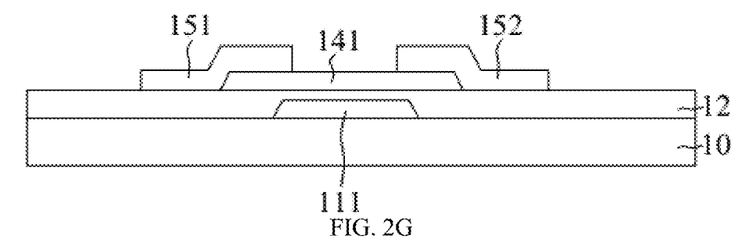

Specifically, a second conductive layer covering the crystallized metal oxide semiconductor layer 141 and the gate insulating layer 12 is formed by physical sputtering deposition. The second conductive layer is patterned by a third patterning process to obtain a thin film transistor array substrate including the source/drain. The source/drain includes the source 151 and the drain 152, as shown in FIG. 2G. A thickness of the second conductive layer is 1000 Angstroms-10000 Angstroms. The material for preparing the second conductive layer is selected from at least one of molybdenum, aluminum, titanium, copper, and silver.

In the method for manufacturing a thin film transistor array substrate according to this embodiment, form a plurality of dispersed metal oxide grains on a substrate; form an amorphous metal oxide semiconductor layer in contact with the plurality of metal oxide grains, and at least one metal element in the metal oxide grain is same as metal elements in the metal oxide semiconductor layer; perform an annealing process on the amorphous metal oxide semiconductor layer. The metal oxide grains are used to induce crystallization during the annealing process of the metal oxide semiconductor layer, which reduces the crystallization temperature required for annealing the amorphous metal oxide semiconductor layer, improves the stability of the metal oxide film transistor, and facilitates the mass production of the metal oxide thin film transistor display plane.

Figure 6:
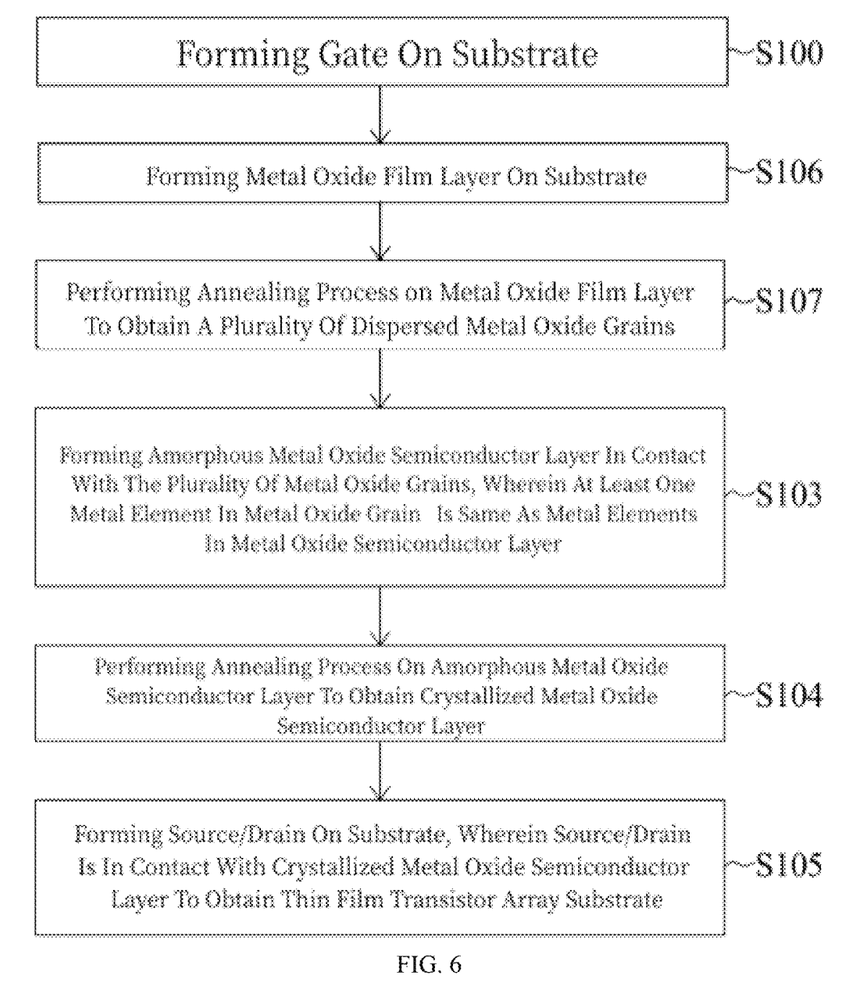
FIG. 6 is a flowchart of manufacturing a thin film transistor array substrate according to a second embodiment of the present disclosure.

Referring to FIG. 6, FIG. 6 is a flowchart of manufacturing a thin film transistor array substrate according to a second embodiment of the present disclosure. The flowchart shown in FIG. 6 is substantially similar to the flowchart shown in FIG. 1, except that S106 in FIG. 6 replaces S101 in FIG. 1, and S107 in FIG. 6 replaces S102 in FIG. 1.

S106 is substantially similar to S101, except that the thickness of the metal oxide film layer 13 is greater than or equal to 10 nm and less than or equal to 200 nm. That is, the thickness of the metal oxide film layer in S106 is thinner, for example, 10 nm, 15 nm, 20 nm, 50 nm, or 100 nm.

In S107, perform the annealing process on the metal oxide film layer 13 to obtain a plurality of dispersed metal oxide grains 131. The condition of the annealing process is that the temperature is greater than or equal to 100° C. and less than or equal to 400° C., and the time of the annealing process is greater than or equal to 1 min and less than or equal to 2 h. The annealing temperature of the metal oxide film layer 13 may be 120° C., 150° C., 180° C., 200° C., 220° C., 250° C., 300° C., 320° C., 350° C., or 380° C., and the annealing time of the metal oxide film layer 13 may be 1 min, 3 min, 15 min, 30 min, 50 min, 60 min, 80 min, 90 min, or 120 min.

In the first embodiment, a plurality of metal oxide grains are obtained by manufacturing a metal oxide film layer having a thicker thickness, and then etching the metal oxide film layer having the thicker thickness. However, in this embodiment, a plurality of dispersed metal oxide crystal grains are obtained by manufacturing the metal oxide film layer having a thinner thickness and performing the annealing process on the metal oxide film layer having the thinner thickness so that the metal oxide film layer having the thinner thickness is crystallized during the annealing process, and shrinks in volume.

Figure 7:
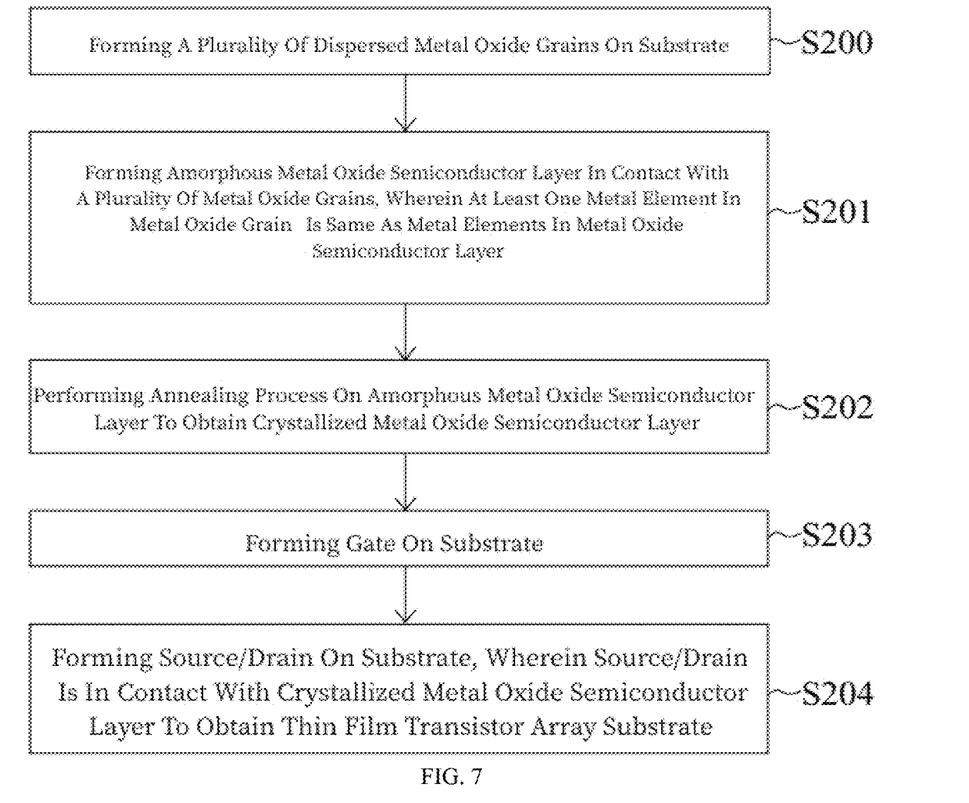
FIG. 7 is a flowchart of manufacturing a thin film transistor array substrate according to a third embodiment of the present disclosure.

Please refer to FIG. 7, FIG. 7 is a flowchart of manufacturing a thin film transistor array substrate according to a third embodiment of the present disclosure. A method of manufacturing the thin film transistor array substrate includes:

S200: Form a plurality of dispersed metal oxide grains on a substrate.

Figure 8A:
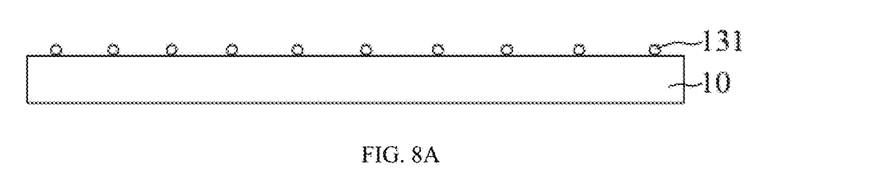
FIG. 8A-8F are schematic diagrams of a manufacturing process of a thin film transistor array substrate according to the third embodiment of the present disclosure.

Specifically, as shown in FIG. 8A, the plurality of dispersed metal oxide grains 131 are formed on a surface of the substrate by using the methods in step S101 and step S102 in the first embodiment described above in sequence, or by the methods in steps S106 and step S107 in the second embodiment in sequence.

S201: Form an amorphous metal oxide semiconductor layer in contact with a plurality of metal oxide grains, wherein at least one metal element in the metal oxide grain is same as metal elements in the metal oxide semiconductor layer.

Figure 8B:
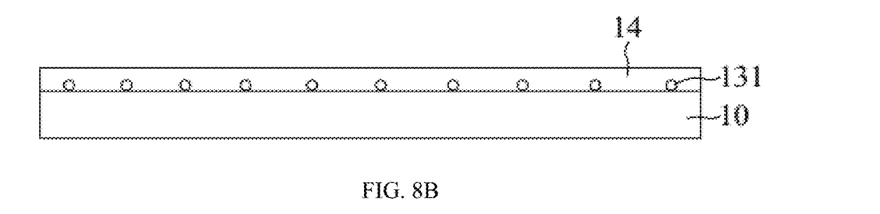

Specifically, as shown in FIG. 8B, the amorphous metal oxide semiconductor layer 14 covering the substrate 10 and the plurality of dispersed metal oxide crystal grains 131 is formed by using the method of step S103 in the first embodiment described above.

S202: Perform an annealing process on the amorphous metal oxide semiconductor layer to obtain a crystallized metal oxide semiconductor layer.

Figure 8C:
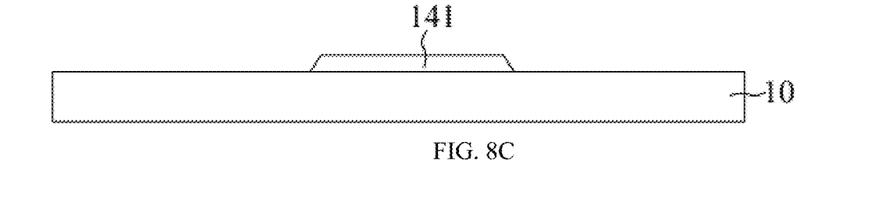
Figure 8D:
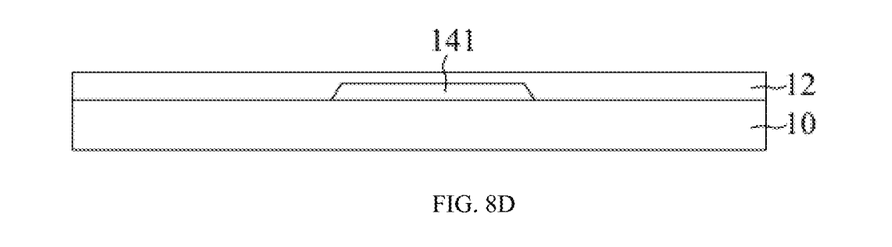

Specifically, the crystallized metal oxide semiconductor layer 141 is formed by using the method of step S104 in the first embodiment described above, as shown in FIG. 8C. A gate insulating layer 12 covering the crystallized metal oxide semiconductor layer 141 and the substrate 10 is formed by using chemical vapor deposition, as shown in FIG. 8D.

S203: Form a gate on the substrate.

Figure 8E:
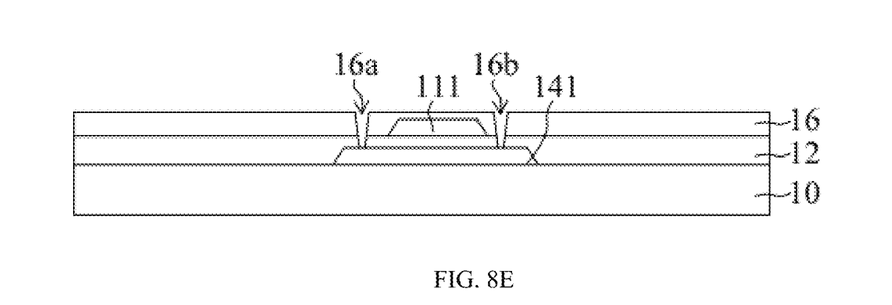

Specifically, a gate 111 is formed on a side of the gate insulating layer 12 away from the crystallized metal oxide semiconductor layer 141. The interlayer insulating layer 16 covering the gate 111 and the gate insulating layer 12 is formed by chemical vapor deposition. The interlayer insulating layer 16 and the gate insulating layer 12 are processed by a yellow photolithography process and an etching process to obtain a first contact hole 16a and a second contact hole 16b penetrating through the interlayer insulating layer 16 and the gate insulating layer 12. The first contact hole 16a and the second contact hole 16b are disposed on opposite sides of the gate 111 and corresponds to the crystallized metal oxide semiconductor layer 141, as shown in FIG. 8E.

The interlayer insulating layer 16 has a thickness of 3000 angstroms to 6000 angstroms. The material for preparing the interlayer insulating layer 16 is selected from at least one of silicon nitride and silicon oxide.

S204: Form a source/drain on the substrate, wherein the source/drain is in contact with the crystallized metal oxide semiconductor layer to obtain a thin film transistor array substrate.

Figure 8F:
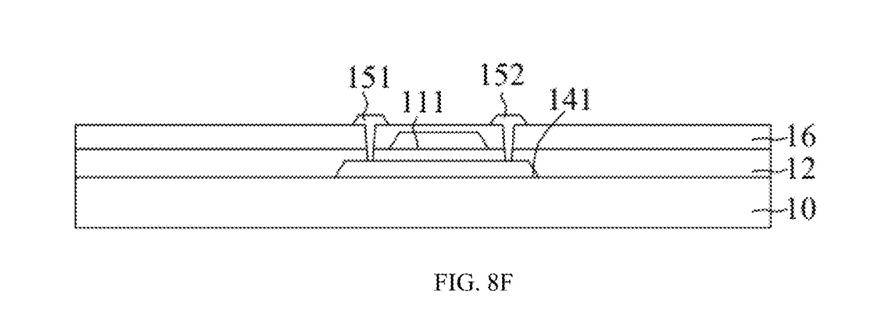

Specifically, a source 151 and a drain 152 are formed by the method of step S105 in the first embodiment described above. The source 151 is in contact with the crystallized metal oxide semiconductor layer 141 through the first contact hole 16a, and the drain 152 is in contact with the crystallized metal oxide semiconductor layer 141 through the second contact hole 16b, as shown in FIG. 8F.

The present disclosure further provides a thin film transistor array substrate which is manufactured by any of the above methods for manufacturing thin film transistor array substrates.

The present disclosure further provides a display panel including the above thin film transistor array substrate.

The description of the above embodiments is merely intended to help understand technical solutions and its core idea of the present disclosure. Those of ordinary skill in the art will appreciate that the technical solutions described in the foregoing embodiments may be modified, or some of the technical features therein may be equivalently replaced. These modifications or substitutions do not make the essence of the corresponding technical solutions deviate from the scope of the technical solutions of the embodiments of the present disclosure.

What is claimed is:

1. A method for manufacturing a thin film transistor array substrate, wherein the method comprises:
forming a metal oxide film layer on a substrate, wherein the metal oxide film layer comprises a crystallized metal oxide and an amorphous metal oxide;
performing a first annealing process on the metal oxide film layer to remove the amorphous metal oxide and retain only the crystallized metal oxide, to obtain a plurality of dispersed and isolated metal oxide grains formed of the crystallized metal oxide on a surface of the substrate, wherein the metal oxide grain has a size greater than or equal to 5 nm and less than or equal to 100 nm;
forming an amorphous metal oxide semiconductor layer on the surface of the substrate to cover and contact the plurality of the metal oxide grains, wherein the amorphous metal oxide semiconductor layer is between the metal oxide grains in a direction perpendicular to the surface of the substrate, and wherein at least one metal element in the metal oxide grain is same as metal elements in the metal oxide semiconductor layer, the metal elements in the metal oxide semiconductor layer comprises at least three of In, Ga, Zn, and Sn, and the at least one metal element in the metal oxide grain comprises one or two of In, Ga, Zn, and Sn; and
performing a second annealing process on the amorphous metal oxide semiconductor layer, to obtain a crystallized metal oxide semiconductor layer.

2. The method for manufacturing the thin film transistor array substrate according to claim 1, wherein a thickness of the metal oxide film layer is greater than or equal to 10 nm and less than or equal to 200 nm to avoid aggregation of the metal oxide grain into the metal oxide grain of a sheet shape.

3. The method for manufacturing the thin film transistor array substrate according to claim 1, wherein a condition of the first annealing process is that a temperature of the first annealing process is greater than or equal to 100° C. and less than or equal to 400° C.

4. The method for manufacturing the thin film transistor array substrate according to claim 1, wherein a thickness of the metal oxide film layer is greater than or equal to 200 nm and less than or equal to 1500 nm.

5. A method for manufacturing a thin film transistor array substrate, wherein the method comprises:
forming a metal oxide film layer on a substrate, wherein the metal oxide film layer comprises a crystallized metal oxide and an amorphous metal oxide;
performing a first annealing process on the metal oxide film layer to remove the amorphous metal oxide and retain only the crystallized metal oxide, to obtain a plurality of dispersed and isolated metal oxide grains formed of the crystallized metal oxide on a surface of the substrate;
forming an amorphous metal oxide semiconductor layer on the surface of the substrate to cover and contact the plurality of the metal oxide grains, wherein the amorphous metal oxide semiconductor layer is between the metal oxide grains in a direction perpendicular to the surface of the substrate, and wherein at least one metal element in the metal oxide grain is same as metal elements in the metal oxide semiconductor layer; and
performing a second annealing process on the amorphous metal oxide semiconductor layer, to obtain a crystallized metal oxide semiconductor layer.

6. The method for manufacturing the thin film transistor array substrate according to claim 5, wherein a thickness of the metal oxide film layer is greater than or equal to 10 nm and less than or equal to 200 nm to avoid aggregation of the metal oxide grain into the metal oxide grain of a sheet shape.

7. The method for manufacturing the thin film transistor array substrate according to claim 5, wherein a condition of the first annealing process is that a temperature of the first annealing process is greater than or equal to 100° C. and less than or equal to 400° C.

8. The method for manufacturing the thin film transistor array substrate according to claim 5, wherein a thickness of the metal oxide film layer is greater than or equal to 200 nm and less than or equal to 1500 nm.

9. The method for manufacturing the thin film transistor array substrate according to claim 5, wherein the removing the plurality of the amorphous metal oxides comprises:
   removing the plurality of the amorphous metal oxides by etching.

10. The method for manufacturing the thin film transistor array substrate according to claim 5, wherein a size of the metal oxide grain is greater than or equal to 5 nm and less than or equal to 100 nm.

11. The method for manufacturing the thin film transistor array substrate according to claim 5, wherein the metal elements in the metal oxide semiconductor layer comprises at least three of In, Ga, Zn, and Sn, and the at least one metal element in the metal oxide grain comprises one or two of In, Ga, Zn, and Sn.

12. The method for manufacturing the thin film transistor array substrate according to claim 11, wherein a material for preparing the metal oxide grains is indium tin oxide, and a material for preparing the metal oxide semiconductor layer is indium gallium zinc oxide.

13. The method for manufacturing the thin film transistor array substrate according to claim 5, wherein the performing the second annealing process on the amorphous metal oxide semiconductor layer comprises:
   heating the amorphous metal oxide semiconductor layer for 0.5 h to 1.5 h at a temperature greater than or equal to 300° C. and less than or equal to 450° C.

14. The method for manufacturing the thin film transistor array substrate according to claim 5, wherein before the forming the metal oxide film layer on the substrate, the method further comprises:
   forming a gate on the substrate; and
   forming a gate insulating layer on the gate and the substrate, and
   the forming the plurality of dispersed metal oxide grains on the substrate comprises:
   forming the plurality of dispersed metal oxide grains on a surface of the gate insulating layer away from the gate.

15. The method for manufacturing the thin film transistor array substrate according to claim 5, after forming the crystallized metal oxide semiconductor layer, the method further comprises:
   forming a gate insulating layer on the crystallized metal oxide semiconductor layer; and
   forming a gate on the gate insulating layer.

16. A display panel comprising a thin film transistor array substrate, wherein the thin film transistor array substrate is manufactured by the method for manufacturing the thin film transistor array substrate according to claim 5.

* * * * *